United States Patent [19]

Sato

[11] Patent Number: 5,514,603
[45] Date of Patent: May 7, 1996

[54] MANUFACTURING METHOD FOR DIAMOND SEMICONDUCTOR DEVICE

[75] Inventor: Junichi Sato, Tokyo, Japan

[73] Assignee: Sony Corporation, Tokyo, Japan

[21] Appl. No.: 330,574

[22] Filed: May 6, 1994

[30] Foreign Application Priority Data

May 7, 1993 [JP] Japan .................................. 5-106329

[51] Int. Cl.$^6$ .................................................. H01L 21/223
[52] U.S. Cl. ........................... 437/16; 437/100; 437/165
[58] Field of Search ........................... 437/16, 17, 100, 437/165, 166; 148/DIG. 148

[56] References Cited

U.S. PATENT DOCUMENTS

| | | | |
|---|---|---|---|
| 4,465,529 | 8/1984 | Arima et al. | 437/165 |
| 4,755,483 | 7/1988 | Haku et al. | 437/100 |
| 4,937,205 | 6/1990 | Nakayama et al. | 437/165 |
| 5,030,580 | 7/1991 | Furukawa et al. | 437/100 |
| 5,270,250 | 12/1993 | Murai et al. | 437/16 |

*Primary Examiner*—Chandra Chaudhari
*Attorney, Agent, or Firm*—Hill, Steadman & Simpson

[57] ABSTRACT

A process of forming a semiconductor which allows n type doping to be applied to a diamond semiconductor layer is carried out so as to form a diamond semiconductor layer on a substrate, forming a layer of $SiO_2$ over the diamond semiconductor layer and forming a resist pattern (14) over the $SiO_2$ layer. Etching processing of the $SiO_2$ layer via the resist pattern is carried out. Then, the exposed diamond layer is subjected to doping process under the following conditions; $N_2=30_{SCCM}$, 1.33 Pa, 100° C., microwave 850 W (2.45 GHz), RF bias 0 W, pulse duty ratio 1:2, a pulse type supply being used for microwave irradiation. Damage to the material by this process imparts high density, doping to the diamond layer. High saturation doping is possible according to this process.

9 Claims, 2 Drawing Sheets

MANUFACTURING METHOD FOR DIAMOND SEMICONDUCTOR DEVICE

BACKGROUND OF THE INVENTION

1. Field of the Invention

The present invention relates generally to a manufacturing process for a semiconductor device. Particularly, the invention relates to a method of doping nitrogen atoms into a diamond semiconductor layer.

2. Description of the Related Art

Artificial diamond material manufactured at substantially low pressure for industrial use has been in use for some time. Recently, under vacuum pressure conditions it has been possible for form a layer of diamond material for use in semiconductor devices.

Compared to silicon, diamond has a higher carrier capacity and much faster transmission characteristics. Further, diamond exhibits a bandgap of 5.5 eV and may operate at much higher temperatures than silicon (i.e. 70° C.). In addition, irradiation strength is high, therefore soft error due to α ray emission as experienced in LSI devices etc., is minimized. According to this, diamond is a preferable material for device required to operate in space (satellites, rockets, etc.), nuclear reactors and other harsh operating environments.

However, among the problems encountered in relation to use of diamond material as a semiconductor layer are that a low cost processing method has not been introduced, n type doping of a diamond conductive layer cannot be carried out and technique for etching processing of complex circuits is not available.

The problem of effecting n type doping by using nitrogen into the diamond semiconductor material has been among the most important factors to be realized to implement greater use of such material in semiconductor devices.

At this, when diamond is used as a material for semiconductor devices, doping efficiency may be extremely low. If a p type doping, that is to boron doping at 1000 ppm, a carrier density of only 10E16 $cm^{-3}$ is obtained. Further, in n type doping hydrogen and carbon are highly present in the diamond material as compared with silicon or the like, and the particle radius of such components are quite small. Consequently, processes used for silicon as applied to diamond material may not use phosphorous. In processing using nitrogen, the particle radius thereof is very close to carbon. However, using nitrogen the problems as set forth below are encountered.

Nitrogen has a high degree of electron resistance, that is, electron energy of 1.7 eV is required. At room temperature, an extremely small number of electrons result and no motion is produced in the crystal, and an effective device will not result. Moreover, if nitrogen is used as a dopant, destruction of the crystal structure will result.

Thus it has been required to provide a technique for n doping of diamond material without destruction of the crystal structure.

SUMMARY OF THE INVENTION

It is therefore a principal object of the present invention to overcome the drawbacks of the related art.

It is a further object of the present invention to provide a simplified process for carrying out n-type doping of nitrogen into a diamond semiconductor material without destruction of the crystal lattice.

It is also an object of the invention to provide a clean process in which cross contamination is kept at a minimum.

In order to accomplish the aforementioned and objects, a method of manufacturing a diamond semiconductor device, comprising the steps of: forming a diamond semiconductor layer on a substrate; and doping nitrogen atoms into the diamond semiconductor layer by using a high density plasma of $1 \times 10^{11} - 1 \times 10^{14}$ $cm^{-3}$ to thereby form a diffusion layer in the diamond semiconductor layer.

DESCRIPTION OF THE PREFERRED EMBODIMENT

Figure 1A:
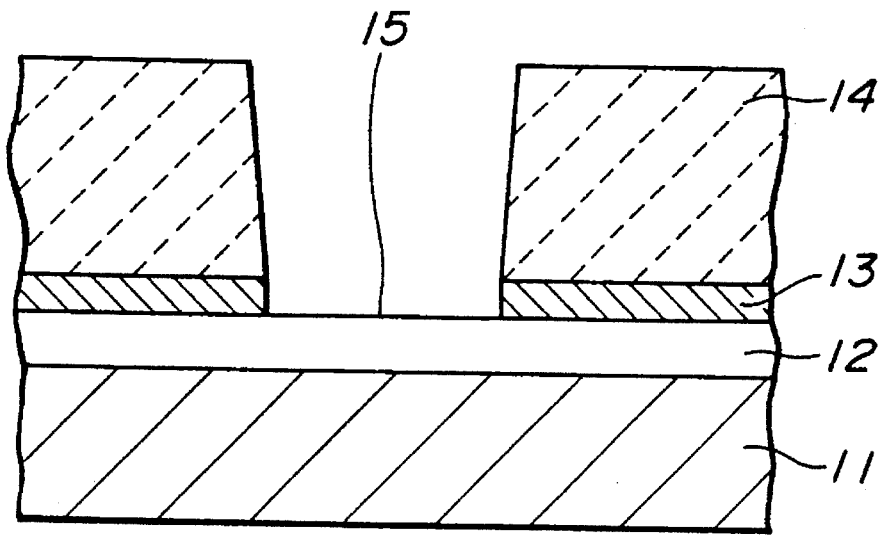
FIGS. 1(A) and 1(B) are cross-sectional diagrams showing steps of the process according to a preferred embodiment of the invention.
Figure 1B:
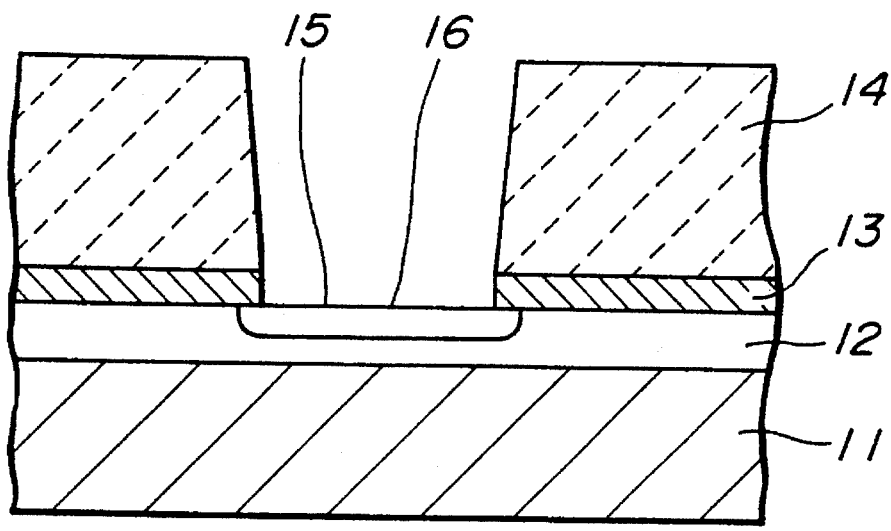
Figure 2:
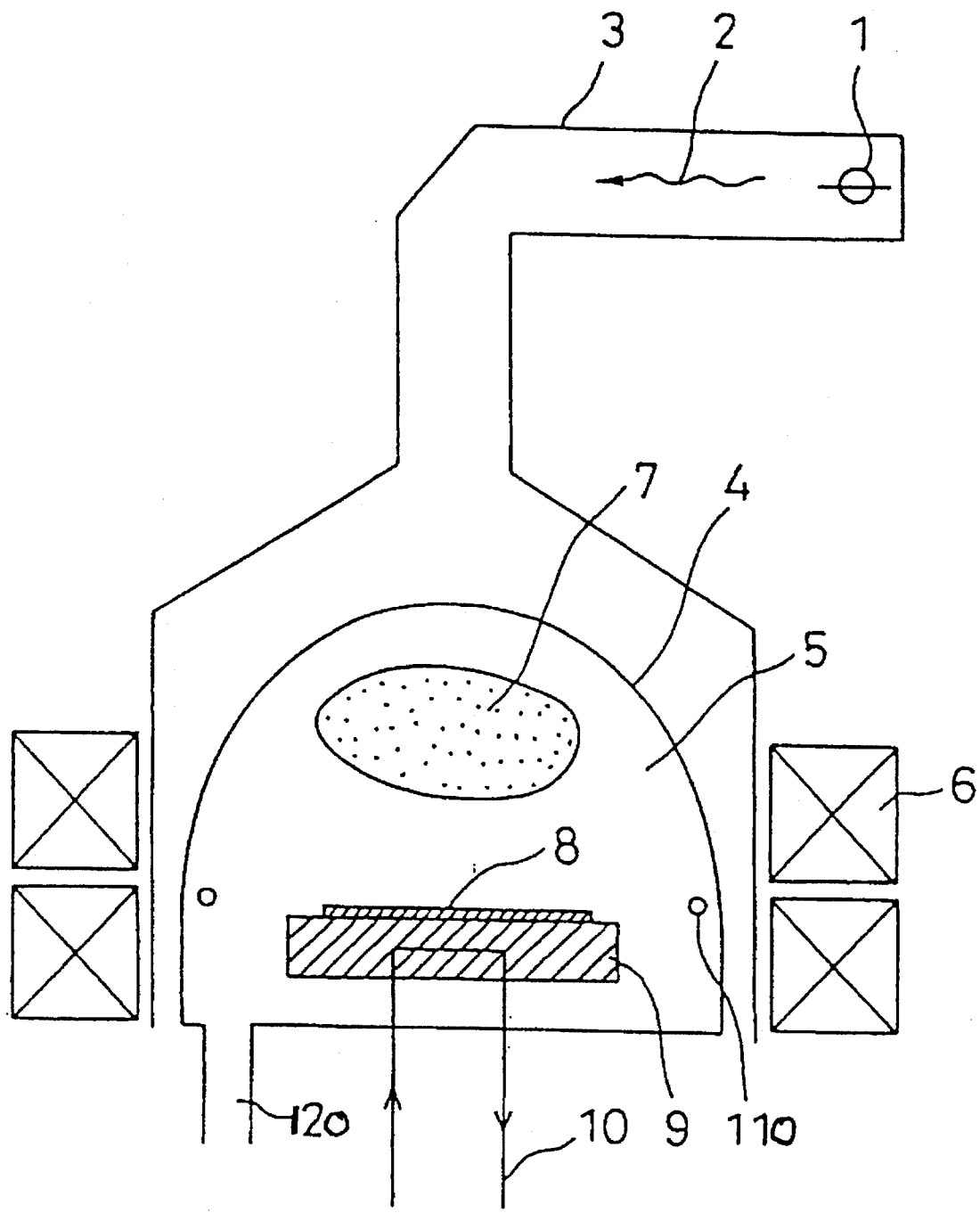
FIG. 2 is a schematic diagram of a magnetic field microwave plasma doping arrangement utilized in the process of the invention.

Referring now to the drawings, particularly to FIGS. 1(A)–2, a preferred embodiment of the invention will be described hereinbelow in detail.

For carrying out the process according to the invention, a magnetic field microwave (ECR) plasma doping arrangement as shown in FIG. 2 is utilized. This includes a magnetron 1 outputting microwaves 2 and a pulse generator (not shown) for controlling irradiation. The microwave radiation is channeled through a conduction chamber 3 to a ceramic bell jar 4 defining a reaction chamber 5. At a solenoid coil 6, a microwave frequency (2.45 GHz), and a so-called ECR discharge magnetism (8.75E-2T) are established and a gas plasma 7 is generated. A substrate 8 is placed on a susceptor 9, the susceptor 9 may be movable by moving means (not shown). The susceptor 9 is heated by a heater (not shown), thus heating the substrate 8 as well. Gas outlets 11 communicate with an exhaust shaft 120 for removing the gas plasma from the reaction chamber 5.

According to a first embodiment of process according to the present invention, referring to FIG. 1(A), a diamond semiconductor layer 12 is formed on a substrate 11 by low pressure synthesis which is carried out under a low pressure, e.g., about 100 Torr, then an $SiO_2$ layer 13 is formed by a method such as plasma CVD (vapor deposition) to a thickness of 200 nm. A resist layer 14 is formed over the $Sio_2$ layer and etching processing is carried out and an exposed portion 15 of the diamond semiconductor layer 12 may then be processed to form a diffusion layer 16 (FIG. 1(B)) as will be explained hereinlater.

In this condition, as shown in FIG. 2, processing is carried out under the conditions as set out below:

Gas and flow rate: $N_2 = 30_{SCCM}$

Pressure: 1.33 Pa

Temperature: 100° C.

Microwave Characteristics: 850 W (2.45 GHz)

RF bias: 0 W

Pulse Duty Ratio: 1:2

According to processing, a high density ($10^{14}$ $cm^{-3}$) plasma is produced. The doping diffusion layer is thus exposed to a high density of nitrogen atoms and doping processing is commenced. The high density of nitrogen atoms is enhanced according to damage imposed on the walls of the reaction chamber etc. According to this, microwave generation is controlled in a pulsative manner although continuous irradiation of microwaves is also possible within the scope of the invention.

Referring again to FIGS. 1(A) and (B) a second embodiment of the invention will be described. According to the second embodiment, a dry cleaning step is further included.

According to the present embodiment, a diamond semiconductor layer 12 is formed on a substrate 11 by a low pressure forming method, then an $SiO_2$ layer 13 is formed by a process such as plasma CVD (chemical vapor deposition) to a thickness of 200 nm. A resist layer 14 is formed over the $SiO_2$ layer and etching processing is carried out and an exposed portion 15 is formed. In this condition, the substrate is supplied to the plasma doping arrangement shown in FIG. 2. At this time dry cleaning processing is applied to the surface of the exposed portion 15 of the diamond semiconductor layer 12. The dry cleaning can be effected by ECR plasma. It is possible to carry out etching processing at this time by application of RF bias. Also, according to the present embodiment, the processing may be carried out at 30° C. It will also be noted that continuous microwave irradiation is implemented. $N_2O$ is utilized at a diamond etching gas in the present embodiment.

According to the second embodiment, processing is carried out under conditions as set out below:

Gas and flow rate: $N_2O=30_{SCCM}$

Pressure: 1.33 Pa

Temperature: 30° C.

Microwave Characteristics: 850 W (2.45 GHz)

RF bias: 30 W

Hereinbelow, a third embodiment of the process of the invention will be explained.

According to this embodiment, the same process steps are followed to arrive at the condition of FIG. 1(B), wherein the exposed portion 15 is defined on the diamond semiconductor layer 12. The doping processing is carried out substantially under the conditions of the first embodiment as seen below.

Gas and flow rate: $N_2O=30_{SCCM}$

Pressure: 1.33 Pa

Temperature: 100° C.

Microwave Characteristics: 850 W (2.45 GHz)

RF bias: 0 W

Pulse Duty Ratio: 1:2

However, according to the present embodiment, a higher plasma density is generated ($10^{14}$ cm$^{-3}$). Thus, high density nitrogen doping is applied to the diamond semiconductor layer 12. The same dry cleaning and doping processing as taught in the second embodiment may further be employed. $N_2O$ is utilized as the processing gas.

It will be noted that the above processing is carried out at relatively low temperature such that deformation of the resist layer is avoided.

Further, since nitrogen gas is used for both of dry cleaning and doping, cross-contamination is minimized.

It will be understood that, although the above-described embodiments are disclosed as utilizing ECR plasma, a helicon wave inducing arrangement utilizing a helical resonance device and a helicon wave plasma, ICP (inductive coupled plasma, TCP (transformer coupled plasma), or the like may alternatively be used according to the invention.

Thus, according to the invention as set forth above, n type doping of high saturation may be applied to a diamond semiconductor layer at substantially low cost. Further, the process according to the invention is simplified and easy to carry out while cross contamination is minimized.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method of manufacturing a diamond semiconductor device, comprising the steps of:

forming a diamond semiconductor layer on a substrate; and doping nitrogen atoms into the diamond semiconductor layer by using a high density plasma of $1\times10^{11}$–$1\times10^{14}$ cm$^{-3}$ to thereby form a diffusion layer in the diamond semiconductor layer.

2. A method as claimed in claim 1, wherein said high density plasma comprises an ECR plasma produced by pulse microwave.

3. A method as claimed in claim 2, further comprising a dry cleaning step for cleaning a surface of the diamond semiconductor layer before the doping process.

4. A method as claimed in claim 3, wherein said dry cleaning step is conducted using the ECR plasma.

5. A method as claimed in claim 3, wherein said dry cleaning and doping steps are both carried out in a plasma chamber.

6. A method as claimed in claim 1, wherein said doping is conducted to an exposed portion of the diamond semiconductor layer after forming a patterned insulating layer and a resist layer.

7. A method as claimed in claim 3, wherein said dry cleaning step is conducted by using an etching gas of $N_2O$.

8. A method as claimed in claim 1, wherein said high density plasma is produced by continuous microwave irradiation.

9. A method as claimed in claim 1, further comprising a dry cleaning step for cleaning a surface of the diamond semiconductor layer before the doping process.

* * * * *